(12) United States Patent
Huang

(10) Patent No.: US 7,893,855 B2
(45) Date of Patent: Feb. 22, 2011

(54) DELTA-SIGMA ANALOG-TO-DIGITAL CONVERTER

(75) Inventor: Sheng-Jui Huang, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 43 days.

(21) Appl. No.: 12/485,924

(22) Filed: Jun. 17, 2009

(65) Prior Publication Data

US 2010/0066577 A1    Mar. 18, 2010

Related U.S. Application Data

(60) Provisional application No. 61/097,522, filed on Sep. 16, 2008.

(51) Int. Cl.
*H03M 3/00* (2006.01)

(52) U.S. Cl. .................................. 341/143; 341/155

(58) Field of Classification Search ................ 341/143, 341/159, 200
See application file for complete search history.

(56) References Cited

U.S. PATENT DOCUMENTS

| | | | | |
|---|---|---|---|---|
| 4,596,978 | A * | 6/1986 | Fujita | 341/159 |
| 6,346,898 | B1 * | 2/2002 | Melanson | 341/143 |
| 6,480,134 | B1 * | 11/2002 | Sasaki | 341/159 |
| 6,642,873 | B1 * | 11/2003 | Kuang | 341/143 |
| 6,975,259 | B1 * | 12/2005 | Jensen | 341/143 |
| 7,227,491 | B2 * | 6/2007 | Doerrer et al. | 341/158 |
| 7,298,306 | B2 * | 11/2007 | Melanson | 341/143 |
| 7,375,666 | B2 * | 5/2008 | Melanson | 341/143 |
| 7,616,057 | B2 * | 11/2009 | Sutardja | 330/98 |
| 7,688,236 | B2 * | 3/2010 | Di Giandomenico et al. | 341/120 |

OTHER PUBLICATIONS

Yang, A 100mW 10MHz-BW CT Delta-Sigma Modulator with 87dB DR and 91dBc IMD, ISSCC Digest of Technical Papers, Feb. 2008.

Dorrer, A 3mW 74dB SNR 2MHz CT Delta-Sigma ADC with a Tracking-ADC-Quantizer in 0.13um CMOS, ISSCC Digest of Technical Papers, Feb. 2005.

Mitteregger, A 14b 20mW 640MHz CMOS CT Delta-Sigma ADC with 20MHz Signal BW and 12b ENOB, ISSCC Digest of Technical Papers, Feb. 2006.

van Veldhoven, A Tri-Mode Continuous-Time Sigma-Delta Modulator with Switched-Capacitor Feedback DAC for a GSM-EDGE/CDMA2000/UMTS Receiver, ISSCC Digest of Technical Papers, Feb. 2003.

(Continued)

*Primary Examiner*—Khai M Nguyen
(74) *Attorney, Agent, or Firm*—Winston Hsu; Scott Margo

(57) ABSTRACT

An exemplary continuous-time delta-sigma analog-to-digital converter includes a loop filter, a quantizer, a dynamic element matching circuit, a latch, and a digital-to-analog converter (DAC). The loop filter contains a plurality of integrators coupled in series, including a first integrator and a second integrator; a first positive feedback resistive element, placed in a first positive feedback path between a first output node of the second integrator and a first input node of the first integrator; and a first negative feedback resistive element, placed in a first negative feedback path between a second output node of the second integrator and a second input node of the first integrator. The quantizer is implemented using a domino quantizer. The DAC contains a plurality of DAC units each having a capacitive device, a resistive device, and a switch device coupled between the capacitive device and the resistive device.

15 Claims, 11 Drawing Sheets

OTHER PUBLICATIONS

Ouzounov, A 1.2V 121-Mode CT Delta-Sigma Modulator for Wireless Receivers in 90nm CMOS, ISSCC Digest of Technical Papers, Feb. 2007.

Ivanov, "Operational Amplifier Speed and Accuracy Improvement," p. 52, figure 3-14, Kluwer Academic Publishers, Boston.

* cited by examiner

| MSB | | | | | | LSB |
|---|---|---|---|---|---|---|
| $CR_6$ | $CR_5$ | $CR_4$ | $CR_3$ | $CR_2$ | $CR_1$ | $CR_0$ |
| 0 | 1 | 0 | 1 | 1 | 1 | 1 |

| $Q6$ | $Q5$ | $Q4$ | $Q3$ | $Q2$ | $Q1$ | $Q0$ |
|---|---|---|---|---|---|---|
| 0 | 0 | 0 | 1 | 1 | 1 | 1 |

DELTA-SIGMA ANALOG-TO-DIGITAL CONVERTER

CROSS REFERENCE TO RELATED APPLICATIONS

This application claims the benefit of U.S. Provisional Application No. 61/097,522, filed on Sep. 16, 2008 and incorporated herein by reference.

BACKGROUND

The present invention relates to converting an analog input into a digital output, and more particularly, to a delta-sigma analog-to-digital converter with innovative designs of the loop filter, the quantizer, the digital-to-analog converter, and/or the operational amplifier(s) included therein.

In today's world, the market for information and communication technology is expanding as never before. Not surprisingly, wireless communication has become more and more important. Nowadays, a variety of wireless communication systems have been developed. In general, the wireless signals are received by an antenna, and the desired frequency band is selected from the received spectrum. Next, the selected frequency band undergoes a plurality of signal processing stages, including analog filtering, amplification, demodulation, analog-to-digital conversion, etc. Further signal processing is done in the digital domain by a digital circuit, such as a digital signal processor (DSP).

Important trends in the receiver design for wireless communication applications are: smaller product size, lower product cost and longer stand-by time. Products can be made smaller and cheaper by increasing the level of integration. This means on-chip integration of external components, such as inductors and filters. Thus, an important role can be played by an analog-to-digital converter (ADC) implemented in the receiver. More specifically, shifting the ADC towards the antenna side of the receiver would allow more digital integration of (external) analog functions on a single chip. However, this requires the implemented ADC with high linearity, dynamic range and bandwidth capabilities.

Continuous-time delta-sigma modulation is a good technique for analog-to-digital conversion as it incorporates inherent anti-aliasing filtering, excellent linearity performance, and low-power capability. Therefore, a continuous-time delta-sigma analog-to-digital converter manifests itself in a wireless communication system, such as a GSM/WCDMA system, as an indispensable building block. In this way, most part of the front-end gain adaptation and blocker filtering can be dealt with in the DSP which is robust and scalable.

In view of above, how to design a continuous-time delta-sigma analog-to-digital converter satisfying requirements of a designated application, such as a wireless communication receiver, becomes a challenge to the circuit designer.

SUMMARY

In accordance with exemplary embodiment of the present invention, a delta-sigma analog-to-digital converter, such as a continuous-time delta-sigma analog-to-digital converter, with innovative designs of the loop filter, the quantizer, the digital-to-analog converter, and/or the operational amplifier(s) included therein is proposed.

According to a first aspect of the present invention, a loop filter implemented in a delta-sigma analog-to-digital converter is disclosed. The loop filter includes: a plurality of integrators coupled in series, comprising a first integrator and a second integrator; a first positive feedback resistive element, placed in a first positive feedback path between a first output node of the second integrator and a first input node of the first integrator; and a first negative feedback resistive element, placed in a first negative feedback path between a second output node of the second integrator and a second input node of the first integrator.

According to a second aspect of the present invention, a quantizer implemented in a delta-sigma analog-to-digital converter is disclosed. The quantizer includes a comparing circuit and a processing circuit. The comparing circuit is implemented for comparing an analog input with a plurality of different reference voltages to derive a plurality of comparison results, respectively, wherein each of the comparison results has either a first logic value or a second logic value. The processing circuit is coupled to the comparing circuit, and implemented for generating a plurality of output logic values according to the comparison results. When the comparison results include at least one first logic value and at least one second logic value, the processing circuit is operative to make an output logic value corresponding to each comparison result in a portion of the comparison results have the first logic value and an output logic value corresponding to each comparison result in a remaining portion of the comparison results have the second logic value, wherein each comparison result in the portion of the comparison results corresponds to a reference voltage greater than a reference voltage to which each comparison result in the remaining portion of the comparison results corresponds.

According to a third aspect of the present invention, a digital-to-analog convert (DAC) implemented in a delta-sigma analog-to-digital converter is disclosed. The DAC includes at least a DAC unit which is operated according to a clock signal to convert an input bit into an analog output and includes a capacitive device, a resistive device, and a switch device. The resistive device is coupled between an operational amplifier input port of the delta-sigma analog-to-digital converter and the switch device, and outputs the analog output to the operational amplifier input port. The switch device is coupled between the capacitive device and the resistive device, and is implemented for disconnecting the resistive device from the capacitive device and connecting a power source to the capacitive device to pre-charge the capacitive device when the clock signal is at a first logic level, and for disconnecting the power source from the capacitive device and connecting the resistive device to the capacitive device to generate the analog output in response to the input bit when the clock signal is at a second logic level different from the first logic level.

According to a fourth aspect of the present invention, an operational amplifier implemented in a delta-sigma analog-to-digital converter is disclosed. The operational amplifier includes: a first signal processing block, coupled between an input port and an output port of the operational amplifier; a second signal processing block, coupled between the input port and the output port of the operational amplifier, wherein compared with the first signal processing block, the second signal processing block has a lower gain and a higher bandwidth; a first current clamping circuit, coupled to the first signal processing block, for clamping a first bias current provided to the first signal processing block; and a second current clamping circuit, coupled to the second signal processing block, for clamping a second bias current provided to the second signal processing block.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
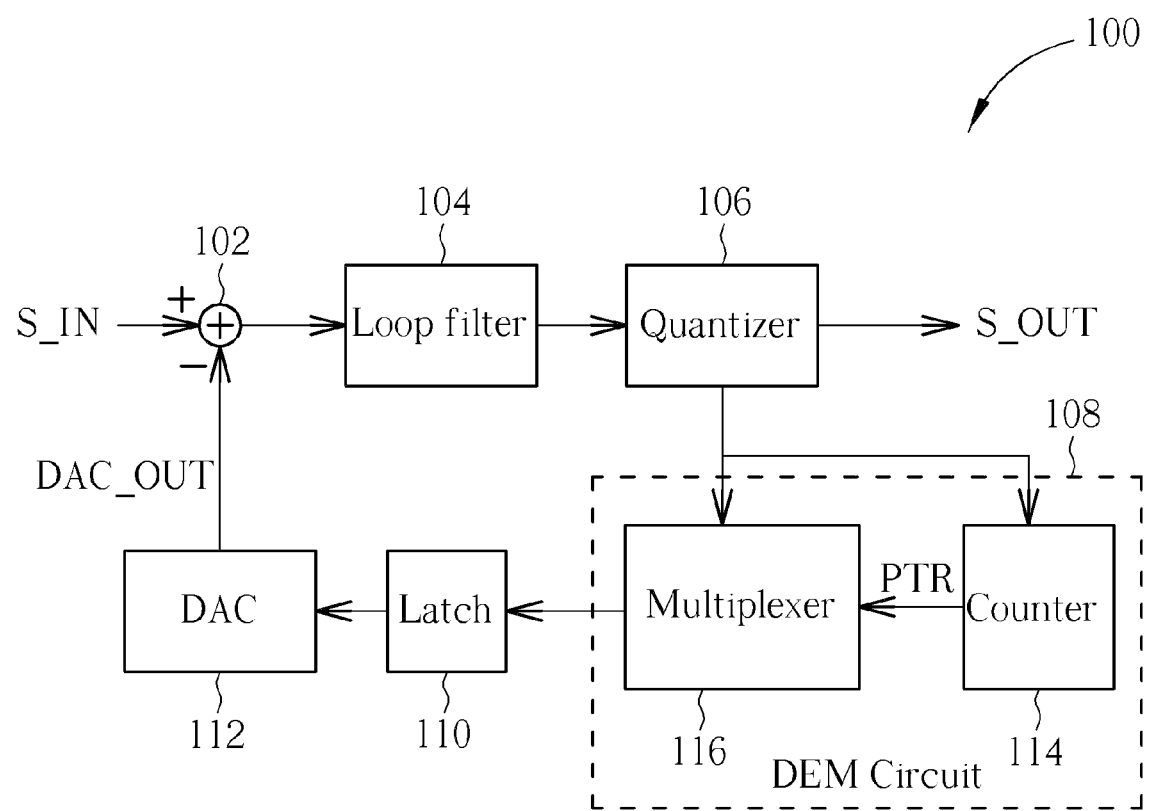
FIG. 1 is a block diagram of a continuous-time delta-sigma analog-to-digital converter according to an exemplary embodiment of the present invention.

FIG. 1 is a block diagram of a continuous-time delta-sigma analog-to-digital converter according to an exemplary embodiment of the present invention. The exemplary continuous-time delta-sigma analog-to-digital converter 100 includes an adder 102, a loop filter 104, a quantizer 106, a dynamic element matching (DEM) circuit 108, a latch 110, and a DAC 112. The adder 102 outputs a difference between an analog input S_IN and a DAC output DAC_OUT to the loop filter 104. The loop filter 104 is designed according to a desired noise transfer function (NTF), and is implemented using operational amplifier(s) and RC element(s). For example, the loop filter 104 includes one or more integrators. An output of the loop filter 104 is processed by the quantizer 106 to derive a digital output S_OUT.

Figure 2:
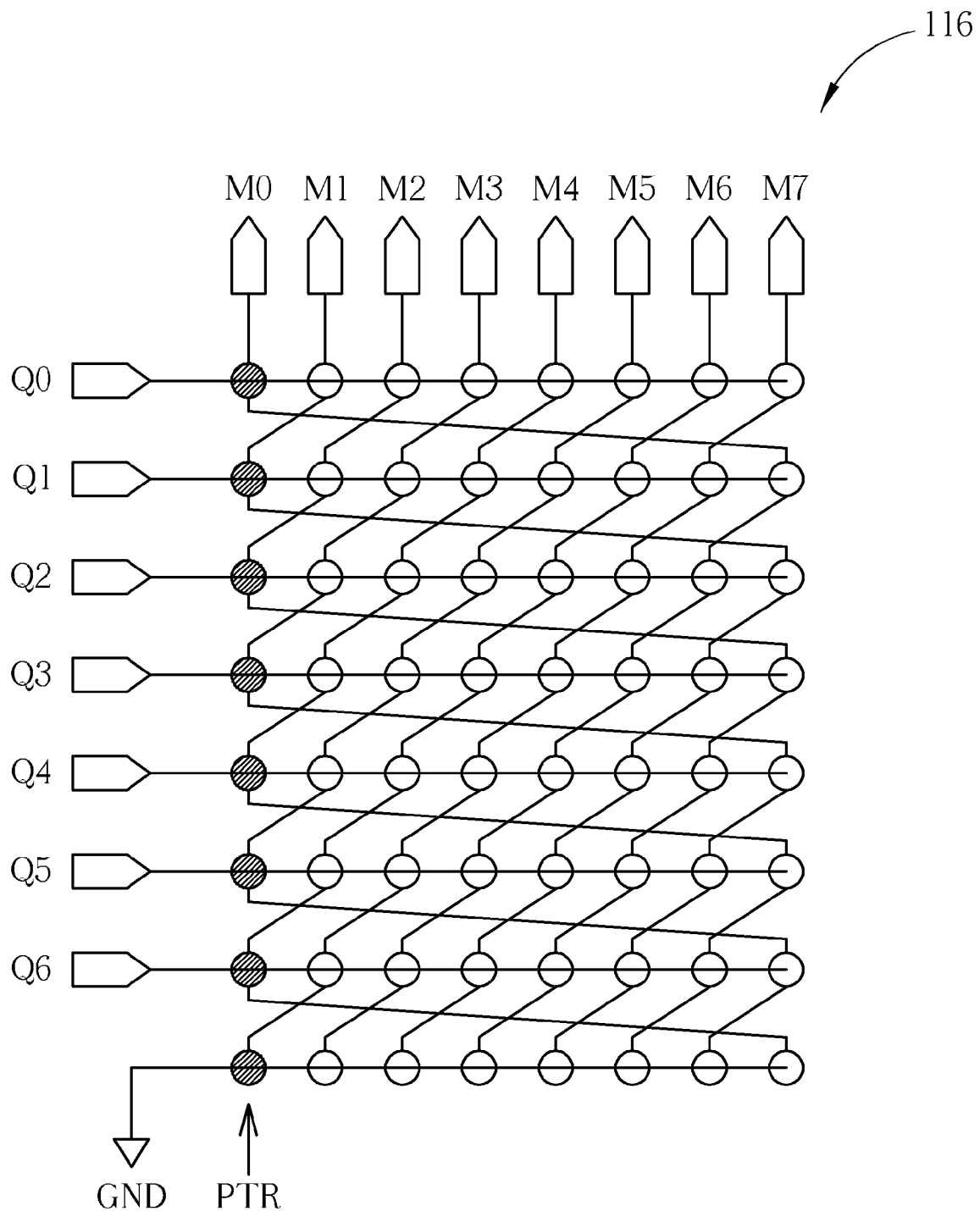
FIG. 2 is a diagram showing an exemplary implementation of a multiplexer shown in FIG. 1.

In this exemplary embodiment, the DAC 112 is implemented using a multi-bit switched-capacitor DAC instead of a one-bit DAC. The choice of the multi-bit DAC here allows an implementation of a low-order loop filter with moderate out-of-band gain (e.g., 7.56 dB) in the NTF that provides, for example, 96 dB signal-to-quantization-noise ratio (SQNR). The compact loop filter entails less signal routing and stray capacitance which is preferred in a high-speed operation since the input parasitic capacitance of the operational amplifier will deteriorate the bandwidth of the operational amplifier. As the DAC 112 in this exemplary embodiment is realized using a multi-bit DAC architecture, the DAC 112 therefore includes a plurality of DAC units each for converting an input bit into an analog output. Owing to limited matching property of multiple DAC units, linearization technique, such as the dynamic element matching, is adopted to shape the mismatch. The DEM circuit 108 is therefore employed to average the mismatch between the DAC units implemented in the DAC 112. As shown in FIG. 1, the exemplary DEM circuit 108 includes a counter 114 and a multiplexer 116. The counter 114 generates a selection signal PTR according to a processing result of the quantizer 106, and the multiplexer 116 refers to the selection signal PTR to forward the processing result of the quantizer 106 to selected DAC units for digital-to-analog conversion. For instance, the multiplexer 116 is implemented using a switch matrix consisting of a plurality of switch elements. FIG. 2 is a diagram showing an exemplary implementation of the multiplexer 116 shown in FIG. 1. Each circle shown in FIG. 2 represents a switch element. Suppose that the DAC 112 has eight DAC units implemented therein. Therefore, the output bits M0-M7 will be respectively forwarded to the DAC units for digital-to-analog conversion. More specifically, the switch matrix is essentially a union of eight 8-to-1 multiplexer units each controlled by the selection signal PTR. The multiplexer outputs of the eight 8-to-1 multiplexer units act as output bits M0-M7, respectively; that is, based on the setting of the selection signal PTR and the actual configuration of the 8-to-1 multiplexer units, each of the 8-to-1 multiplexer units selects one of the input bits Q0-Q6 and the ground level GND to be a multiplexer output acting as a corresponding output bit. As shown in FIG. 2, the current selection made by the selection signal PTR makes the input bits Q0-Q6 and the ground level GND serve as output bits M0-M7, respectively; however, if the selection signal PTR is shifted to the next position, the new selection made by the selection signal PTR makes the input bits Q0-Q6 and the ground level GND serve as output bits M1-M7 and M0, respectively. In an exemplary case where the processing result of the quantizer 106 has two bits Q0 and Q1, the current selection made by the selection signal PTR shown in FIG. 2 makes the input bit Q0 and Q1 serve as output bits M0 and M1, respectively; and the next selection made by the selection signal PTR will make the input bit Q0 and Q1 serve as output bits M2 and M3, respectively. As the DAC units are selected in a rotation manner, DAC units are effectively shuffled during each digital-to-analog conversion cycle, thereby mitigating the effect caused by the inherent element mismatch.

As shown in FIG. 1, the latch 110 is placed between the DAC 112 and the DEM circuit 108. In this exemplary embodiment, the latch 110 is implemented to hold the output of the multiplexer 114, thereby allowing the DEM circuit 108 to calculate the selection signal PTR for the next cycle in advance. In this way, the DEM circuit 108 can take the full cycle to work efficiently.

As the conception of the present invention does not focus on the designs of the DEM circuit 108 and the latch 110, further description is omitted for the sake of brevity. On the other hand, the present invention proposes innovative designs of the loop filter 104, the quantizer 106, and the DAC 112 included in the exemplary continuous-time delta-sigma analog-to-digital converter 100 shown in FIG. 2. Further details are illustrated as follows.

Figure 3:
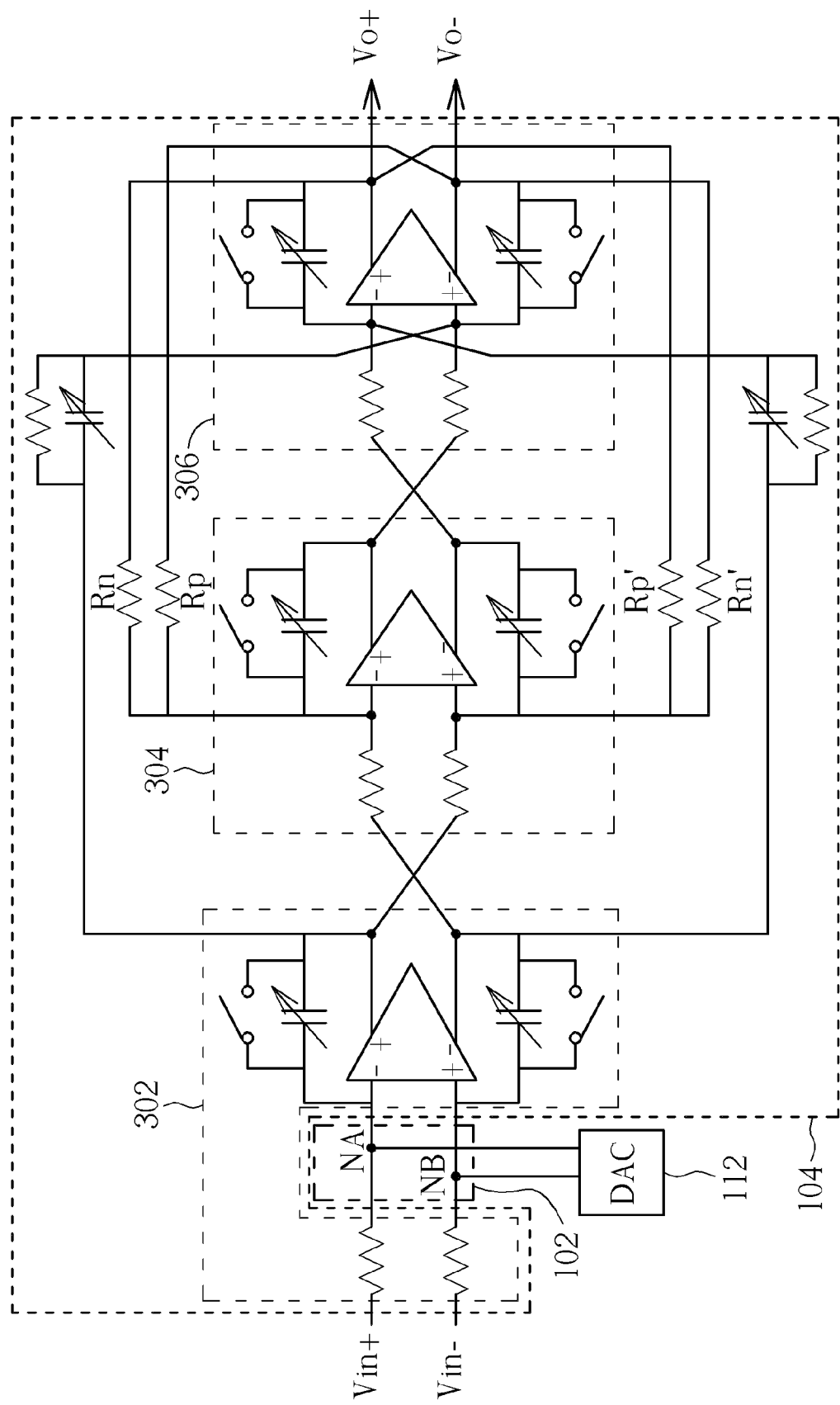
FIG. 3 is a diagram illustrating an exemplary implementation of a loop filter shown in FIG. 1.

FIG. 3 is a diagram illustrating an exemplary implementation of the loop filter 104 shown in FIG. 1. In this exemplary implementation, the loop filter 104 is a $3^{rd}$ order feed-forward loop filter employing an inverse-Chebyshev noise transfer function, and includes a plurality of integrators 302, 304, and 306 coupled in series. The output of the DAC 112 is fed back to loop filter 104 via nodes NA and NB, where the interconnections at nodes NA and NB act as the adder 102 shown in FIG. 1 for adjusting the actual input of the loop filter 104 according to the DAC output of the DAC 112. In addition, there are negative feedback resistive elements $R_n$ and $R_n'$ respectively placed in negative feedback paths between the integrators 304 and 306. Each negative feedback resistive element forms a resonator which places a notch around a specific frequency (e.g., 2 MHz) in the noise transfer function; however, as the feedback coefficient is usually very small, a large resistive value is required for implementing each negative feedback resistive element, which would occupy a large chip area. To solve such a problem, the present invention proposes the use of additional positive feedback resistive elements placed in respective positive feedback paths between the integrators 304 and 306. More specifically, as shown in FIG. 3, one positive feedback resistive element $R_p$ is coupled between a first output node (−) of the integrator 306 and a first input node (−) of the integrator 304, another positive feedback resistive element $R_p'$ is coupled between the second output node (+) of the integrator 306 and the second input node (+) of the integrator 304, the negative feedback resistive element $R_n$ is coupled between the second output node (+) of the integrator 306 and the first input node (−) of the integrator 304, and the negative feedback resistive element $R_n'$ is coupled between the first output node (−) of the integrator 306 and the second input node (+) of the integrator 304.

Figure 4:
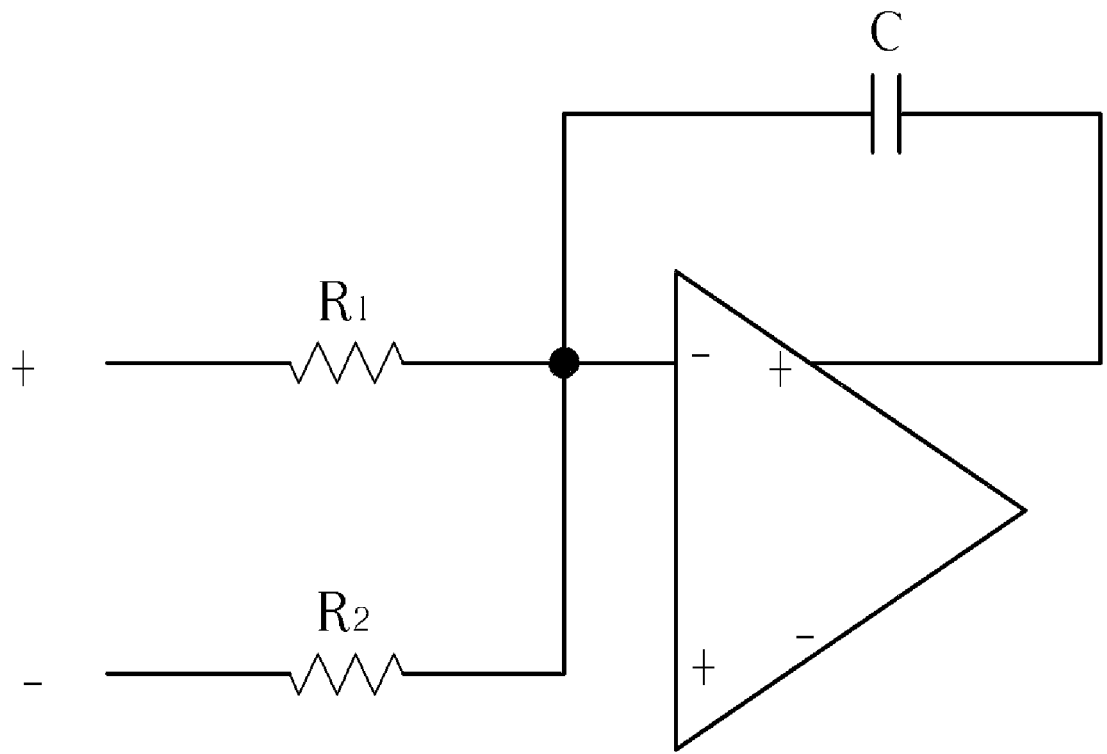
FIG. 4 shows an exemplary circuit model.

With a proper resistive value setting of each positive feedback resistive element, a large effective resistive value can be derived accordingly. In this implementation, the resistive value of the positive feedback resistive element $R_p$ is set greater than the resistive value of the negative feedback resistive element $R_n$; additionally, the resistive value of the positive feedback resistive element $R_p'$ is also set greater than the resistive value of the negative feedback resistive element $R_n'$. Please refer to FIG. 4. The effective resistive value can be estimated using the exemplary circuit model shown in FIG. 4. The transfer function H(s) in the s-domain can be expressed as follows:

$$H(S) = \frac{1}{S \cdot C} \left( \frac{1}{R_1} - \frac{1}{R_2} \right) \quad (1)$$

In above equation (1), C represents a capacitive value of the feedback capacitor, $R_1$ represents the resistive value of the negative feedback resistive element, and $R_2$ represents the resistive value of the positive feedback resistive element. Therefore, as one can see, the effective resistive value $R_{eff}$ for the combination of the positive feedback resistive element and the negative feedback resistive element can be expressed as follows:

$$R_{eff} = \frac{1}{\frac{1}{R_1} - \frac{1}{R_2}} = \frac{R_1 \cdot R_2}{R_2 - R_1} \quad (2)$$

If the resistive value of the positive feedback resistive element is set greater than but close to the resistive value of the negative feedback resistive element (e.g., $R_2 = R_1 + \Delta R$), the effective resistive value $R_{eff}$ becomes:

$$R_{eff} = \frac{R_1 \cdot R_2}{\Delta R}, \text{ where } R_2 = R_1 + \Delta R \quad (3)$$

In this way, a large effective resistive value $R_{eff}$ can be obtained through adding a positive feedback resistive element to a positive feedback path of the loop filter. Compared with the design which uses negative feedback resistive elements only, the proposed design using the combination of positive and negative feedback resistive elements can effectively reduce the resistor size, for example, by 10×.

Figure 5:
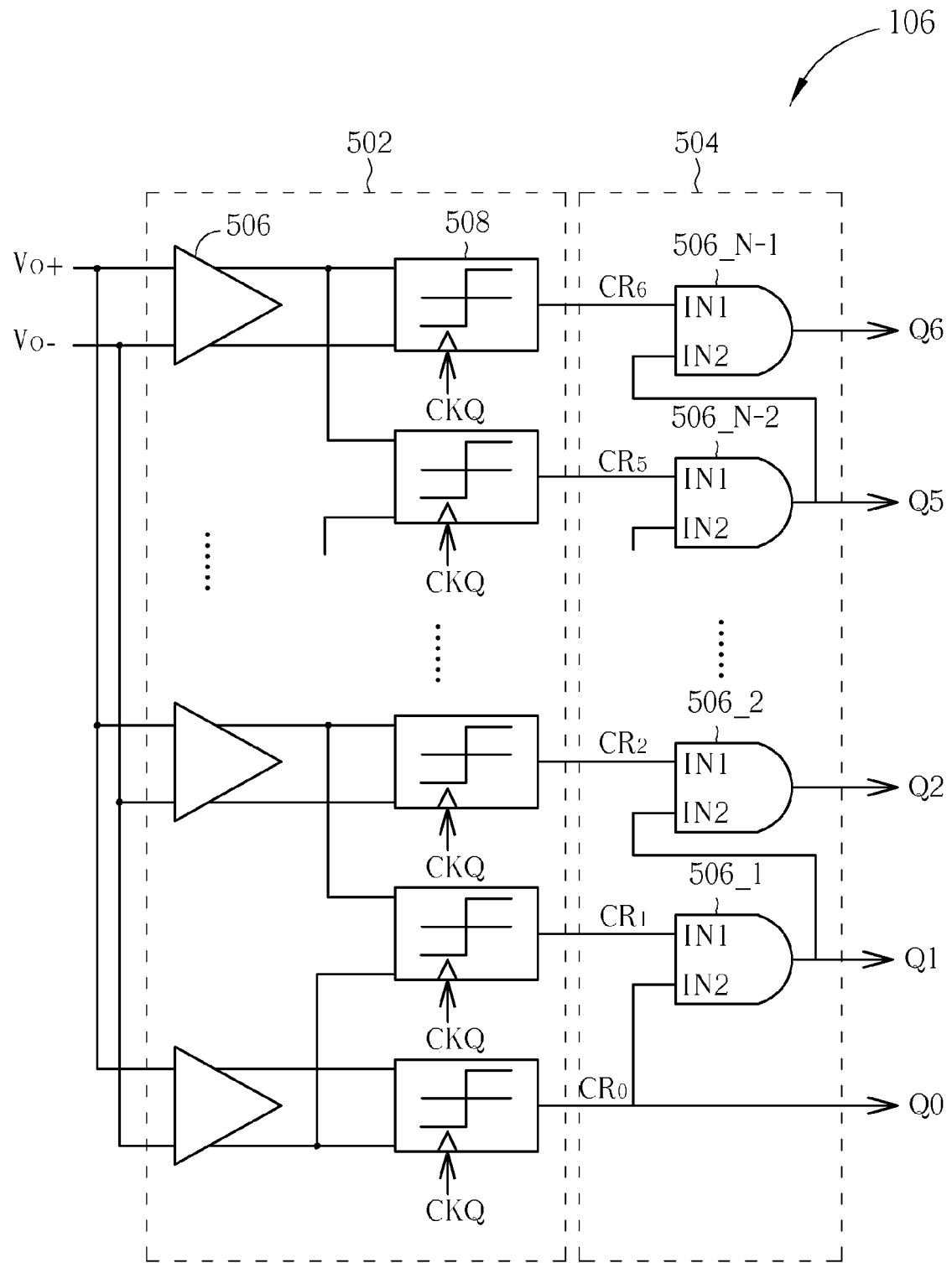
FIG. 5 is a diagram illustrating an exemplary implementation of a quantizer 106 shown in FIG. 1.

FIG. 5 is a diagram illustrating an exemplary implementation of the quantizer 106 shown in FIG. 1. In this exemplary implementation, the quantizer 106 includes a comparing circuit 502 and a processing circuit 504. To put it simply, the comparing circuit 502 is implemented for comparing an analog input, including Vo+ and Vo− generated from the preceding loop filter 104 as shown in FIG. 3, with a plurality of different reference voltages to derive a plurality of comparison results $CR_0$-$CR_6$, respectively, wherein each of the comparison results has either a first logic value or a second logic value. In this exemplary embodiment, the comparing circuit 502 shown in FIG. 5 is implemented using a Flash ADC architecture, also known as a parallel ADC architecture. Therefore, a conventional Flash ADC design including a plurality of pre-amplifiers 506 and a plurality of latches 508 is employed. The latches 508 will regenerate the latched bits at each rising edge of an ADC clock signal CKQ. As details of such a conventional Flash ADC design are well known to those skilled in the pertinent art, further description is omitted here for the sake of brevity.

Furthermore, in this exemplary implementation, a 3-bit Flash ADC architecture is used. Therefore, the digital thermometer code generated from the comparing circuit 502 includes ($2^3$-1) bits $CR_6$, $CR_5$, . . . , $CR_2$, $CR_1$, $CR_0$, where $CR_6$ is the most significant bit (MSB), and $CR_0$ is the least significant bit (LSB). In general, a bit in the digital thermometer code is "1" when the analog input voltage is higher than a corresponding reference voltage compared with the analog input voltage; otherwise, the bit is set by "0". Thus, the point where the digital thermometer code has a transition from "1" to "0" is the point where the analog input voltage becomes smaller than a particular reference voltage. Normally, the digital thermometer code, as known to those skilled in the art, should have a normal pattern such as 0001111 from MSB to LSB. However, errors may cause the digital thermometer code to have an abnormal pattern such as 0101111. This spurious "1" presented in the digital thermometer code is called a bubble error. To effectively remove the bubble error and arbitrate meta-stability condition, the present invention therefore proposes a domino quantizer architecture. The processing circuit 504 is therefore coupled to the comparing circuit 502, and is implemented for generating a plurality of output logic values Q0-Q6 through processing the comparison results $CR_0$-$CR_6$. The operation of the processing circuit 504 can be briefly summarized as follows.

When the comparison results $CR_0$-$CR_6$ include at least one first logic value and at least one second logic value (i.e., the comparison results $CR_0$-$CR_6$ are neither all 0's nor all 1's), it is possible that there is a bubble error in the comparison results $CR_0$-$CR_6$. The processing circuit 504 is therefore implemented to remove the undesired bubble error existing in the comparison results $CR_0$-$CR_6$, thereby generating the output logic values Q0-Q6 which form a digital thermometer code without any bubble error included therein. Regarding the output logic values Q0-Q6 respectively derived from processing the comparison results $CR_0$-$CR_6$, the output logic values Q0-Q6 (i.e., the processing result) generated by the processing circuit 504 can be divided into a first part, which includes one or more output logic values each having the same logic value (e.g., '0') and is associated with a portion of the comparison results $CR_0$-$CR_6$ (e.g., $CR_4$, $CR_5$, and $CR_6$) corresponds to higher reference voltages compared with the analog input generated from the preceding loop filter 104, and a second part, which includes one or more output logic values each having the same logic value (e.g., '1') and is associated with a remaining portion of the comparison results $CR_0$-$CR_6$ (e.g., $CR_0$, $CR_1$, $CR_2$, and $CR_3$) corresponds to lower reference voltages compared with the analog input generated from the preceding loop filter 104. To put it simply, the processing circuit 504 makes an output logic value (e.g., Q4, Q5, or Q6) corresponding to each comparison result in a portion of the comparison results (e.g., $CR_4$, $CR_5$, and $CR_6$) have the first logic value (e.g., '0') and an output logic value (e.g., Q0, Q1, Q2, and Q3) corresponding to each comparison result in a remaining portion of the comparison results (e.g., $CR_0$, $CR_1$, $CR_2$, and $CR_3$) have the second logic value (e.g., '1'), where each comparison result in the portion of the comparison results corresponds to a reference voltage greater than a reference voltage to which each comparison result in the remaining portion of the comparison results corresponds. In other words, the processing circuit 504 prevents following patterns presented in the final output of the quantizer 106: one or more 1's sandwiched by two 0's and one or more 0's sandwiched by two 1's. Further details are illustrated as follows.

In the exemplary implementation shown in FIG. 5, a plurality of logic gates 506_1, 506_2, . . . , 506_N−2, 506_N−1 are used to realize the processing circuit 504. It should be noted that the number of logic gates implemented in the processing circuit 504 depends upon the number of comparison results generated from the comparing circuit 502. For example, provided that the number of the comparison results is equal to a positive integer N, the processing circuit 504 is configured to have (N−1) logic gates. Regarding the exemplary implementation shown in FIG. 5, as the number of comparison results $CR_0$-$CR_6$ is equal to 7 (i.e., N=7), the number of logic gates implemented in the processing circuit 504 is 6 (i.e., N−1=6).

As shown in FIG. 5, the logic gates 506_1, 506_2, . . . , 506_N−2, 506_N−1 are coupled in a domino configuration for generating output logic values Q0-Q6, respectively. Specifically, a second input node IN2 of the leading logic gate (i.e., the logic gate 506_1) receives a comparison result $CR_0$ which directly serves as one output logic value Q0; first input nodes IN1 of the logic gates 506_1, 506_2, . . . , 506_N−2, 506_N−1 receive the comparison results $CR_0$-$CR_6$, respectively; the output node of each of the leading logic gate (i.e., the logic gate 506_1) and the next (N−3) logic gates (i.e., the logic gates 506_2-506_N−2) is coupled to the second input node IN2 of a following logic gate.

Figure 6:
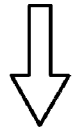
FIG. 6 shows an exemplary operation of a processing circuit shown in FIG. 5.

In this exemplary implementation, each of the logic gates 506_1, 506_2, . . . , 506_N−2, 506_N−1 is an AND gate. Therefore, the combinational logic realized by the processing circuit 504 is to reset subsequent latch outputs to 0's upon detecting any occurrence of zero. Please refer to FIG. 6, which shows an exemplary operation of the processing circuit 504 shown in FIG. 5. As the comparison result $CR_4$ has a logic value "0", the corresponding output logic value Q4 will be "0" due to the inherent characteristic of the AND gate; besides, following output logic values Q5 and Q6 will be 0's due to the cascaded AND gates. As a result, the original thermometer code 0101111 with the bubble problem is adjusted to be a bubble-free thermometer code 0001111.

Please note that, because only one latch output toggles each time and only one or two latch outputs change states from cycle to cycle due to over-sampling, the delay of the AND gate chain won't be problematic. In addition, in above exemplary implementation, each of the logic gates 506_1, 506_2, . . . , 506_N−2, 506_N−1 is simply implemented using an AND gate; however, provided that the same objective of avoiding one or more 1's sandwiched by two 0's and one or more 0's sandwiched by two 1's is achieved, the logic gates 506_1, 506_2, . . . , 506_N−2, 506_N−1 in a domino configuration can also be realized using other logic circuits.

Figure 7:
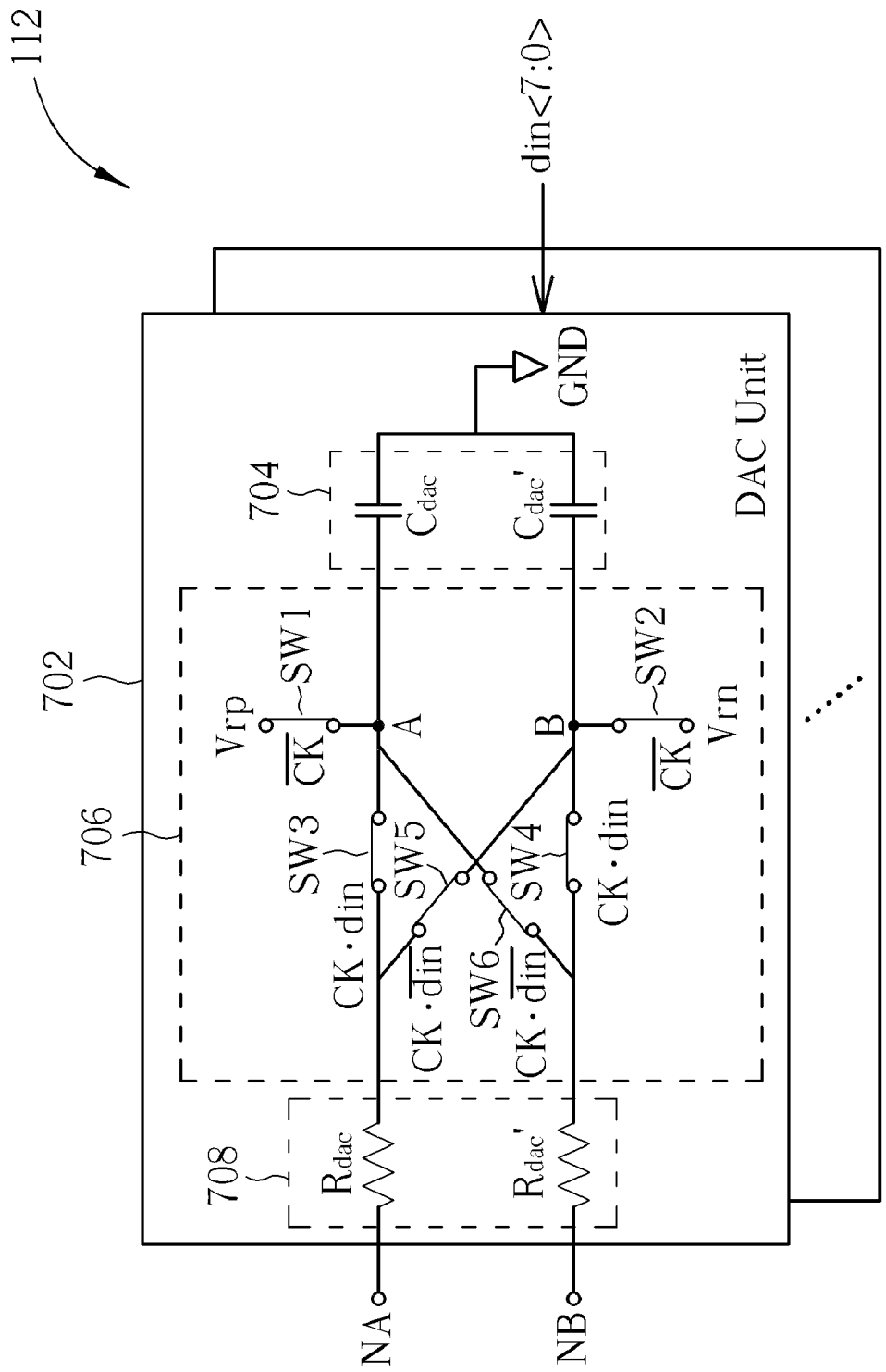
FIG. 7 is a diagram illustrating an exemplary implementation of a digital-to-analog converter shown in FIG. 1.

Another important design aspect is the DAC 112 shown in FIG. 2. Please refer to FIG. 7, which shows an exemplary implementation of the DAC 112. In this exemplary implementation, the DAC 112 is a multi-bit switched-capacitor DAC, and includes a plurality of DAC units 702 operated according to the DAC clock signal CK to convert a plurality of input bits din<7:0> into a plurality of analog outputs, simultaneously and respectively; besides, the DAC 112 outputs the analog outputs to the loop filter 104 via the same nodes NA and NB. In other words, in this exemplary embodiment, the DAC 112 is configured to output the analog outputs to an operational amplifier input port of the loop filter 104 (e.g., the inverting input terminal (−) and/or the non-inverting input terminal (+) of an operational amplifier implemented in the integrator 302). Each DAC unit 702 is configured to have a capacitive device 704, a switch device 706, and a resistive device 708. As shown in FIG. 7, the resistive device 708 is placed at a location closer to an input side of an operational amplifier in the loop filter 104. That is, the resistive device 708 is coupled between an operational amplifier input port within the exemplary continuous-time delta-sigma analog-to-digital converter 100 (e.g., the aforementioned operational amplifier input port of the loop filter 104) and the switch device 706 for outputting an analog output to the operational amplifier input port, and the switch device 706 is coupled between the capacitive device 704 and the resistive device 708 to isolate the clock coupling for improving the total harmonic distortion (THD) greatly. When the clock signal CK is at a first logic level (e.g., "0"), the switch device 706 disconnects the resistive device 708 from the capacitive device 704, and connects a power source, which includes a first supply voltage $V_{rp}$ and a second supply voltage $V_{rn}$, to the capacitive device 704 to pre-charge the capacitive device 704; on the other hand, when the clock signal CK is at a second logic level (e.g., "1"), the switch device 706 disconnects the power source from the capacitive device 704, and connects the resistive device 708 to the capacitive device 704 to generate the analog output in response to the input bit. To put it simply, in a first phase of the DAC unit 702, the capacitive device 704 is pre-charged to store charges in response to the supply voltage; and in a second phase of the DAC unit 702, the charges stored in the capacitive device 704 are transferred to the capacitive elements of the integrator 302 shown in FIG. 3 according to the quantizer output.

In detail, the capacitive device 704 includes a first capacitive element $C_{dac}$ coupled between a grounding node GND and a first node A, and a second capacitive element $C_{dac}'$ coupled between the grounding node GND and a second node B; the resistive device 708 includes a first resistive element $R_{DAC}$ with one end coupled to node NA and a second resistive element $R_{DAC}'$ with one end coupled to node NB; besides, the switch device 706 includes a first switch SW1 coupled between the first supply voltage $V_{rp}$ and the first node A, a second switch SW2 coupled between the second supply voltage $V_{rn}$ and the second node B, a third switch SW3 coupled between the first resistive element $R_{DAC}$ and the first node A, a fourth switch SW4 coupled between the second resistive element $R_{DAC}'$ and the second node B, a fifth switch SW5 coupled between the first resistive element $R_{dac}$ and the second node B, and a sixth switch SW6 coupled between the second resistive element $R_{DAC}'$ and the first node A. As shown in FIG. 7, the on/off states of the first switch SW1 and the second switch SW2 are dominated by $\overline{CK}$, implying that the first switch SW1 and the second switch SW2 are both turned on when the clock signal is at the logic low level (e.g., "0"); the on/off states of the third switch SW3 and the fourth switch SW4 are dominated by CK·din, implying that the third switch SW3 and the fourth switch SW4 are both turned on when the clock signal is at the logic high level and the input bit has the logic value "1"; and on/off states of the fifth switch SW5 and the sixth switch SW6 are dominated by CK·$\overline{din}$, implying that the fifth switch SW5 and the sixth switch SW6 are both turned on when the clock signal is at the logic high level and the input bit has the other logic value "0".

Taking noise contribution and driving capability of the ADC input buffer into consideration, the input resistance of the loop filter 104 (i.e., each resistive element of the integrator 302 shown in FIG. 3) is set by a large resistive value, such as 4 k ohm. In addition, in a case where the input resistance of the loop filter 104 is far greater than the each of the first and second resistive elements $R_{dac}$ and $R_{dac}'$, the input common mode of the operational amplifier is therefore determined by an average of the first supply voltage $V_{rp}$ and the second supply voltage $V_{rn}$. Please note that the time constant $R_{DAC} \cdot C_{DAC}$ affects not only loop gain but also jitter sensitivity. When the power budget is taken into consideration, the time constant $R_{DAC} \cdot C_{DAC}$ in an exemplary implementation is set by 0.1 T, where T is one period of the DAC clock signal CK. Furthermore, in a case where an RZ (Return-to-Zero) coding is used, there is no data-dependent settling issue as the voltages at nodes A and B are reset each cycle due to inherent characteristics of the RZ coding.

Figure 8:
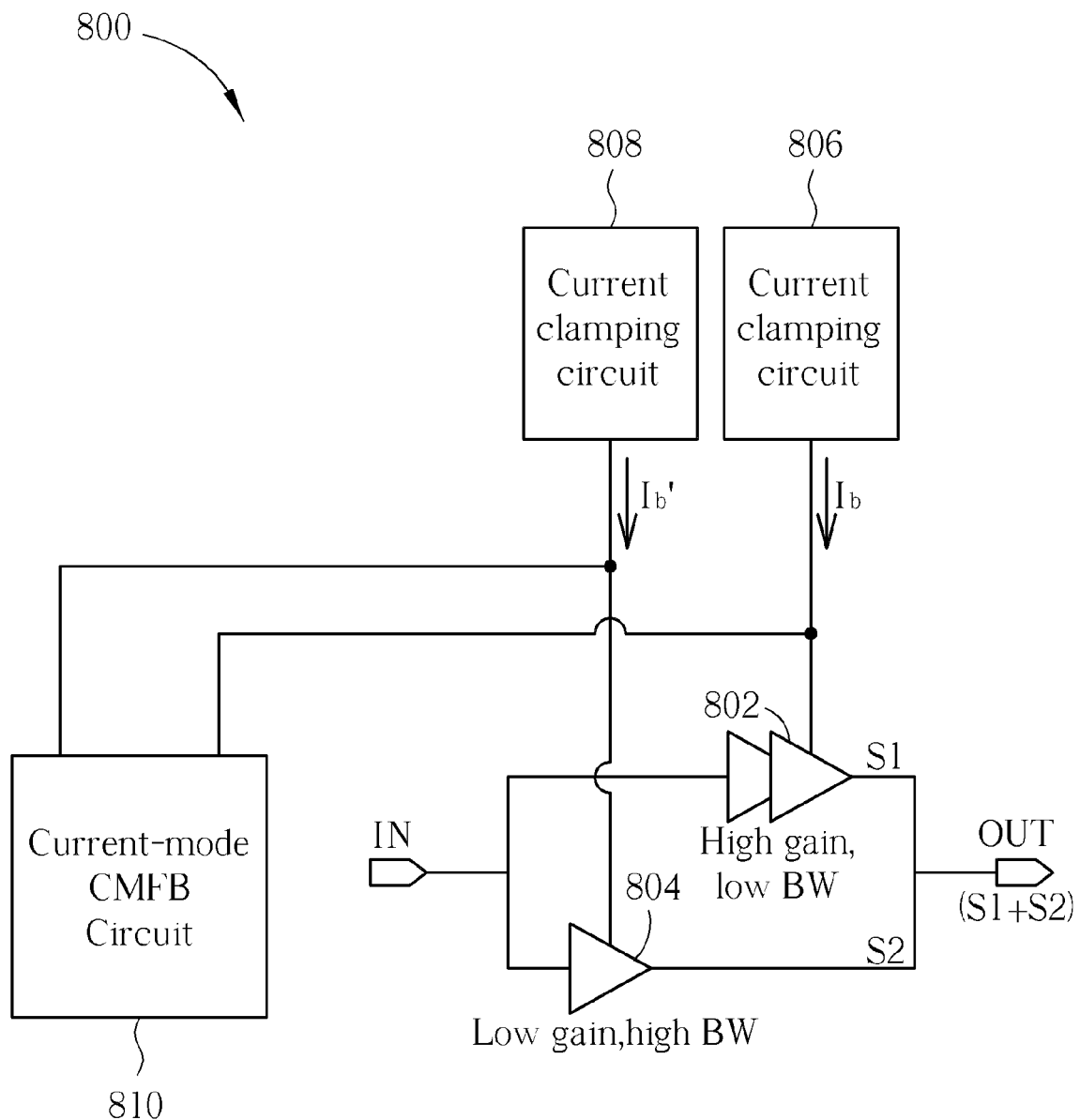
FIG. 8 is a diagram illustrating an exemplary implementation of an operational amplifier according to the present invention.

Regarding the operational amplifier employed in the loop filter 104 shown in FIG. 3, the present invention further proposes an innovative design as shown in FIG. 8. FIG. 8 is a diagram illustrating an exemplary implementation of an operational amplifier according to the present invention. The operational amplifier 800 includes a first signal processing block 802 coupled between an input port IN and an output port OUT of the operational amplifier 800, a second signal processing block 804 coupled between the input port IN and the output port OUT, a plurality of current clamping circuits 806 and 808, respectively coupled to the first signal processing block 802 and the second signal processing block 804, for clamping bias currents Ib and Ib' provided to the first and second signal processing blocks 802 and 804, and a current-mode common-mode feedback (CMFB) circuit 810, coupled to nodes where the current clamping circuits 806 and 808 connected to the first and second signal processing blocks 802 and 804. It should be noted that, compared with the first signal processing block 802, the second signal processing block 804 has a lower gain and a higher bandwidth (BW). In addition, the first signal processing block 802 generates a first output signal S1 according to an input signal at the input port IN, the second signal processing block 804 generates a second output signal S2 according to the same input signal at the input port IN, and the output signal at the output port OUT is equivalent to a combination of the first output signal S1 and the second output signal S2. Besides, the overall frequency response of the combination of the first signal processing block 802 and the second signal processing block 804 is equivalent to a combination of the frequency response of the first signal processing block 802 and the frequency response of the second signal processing block 804.

Figure 9:
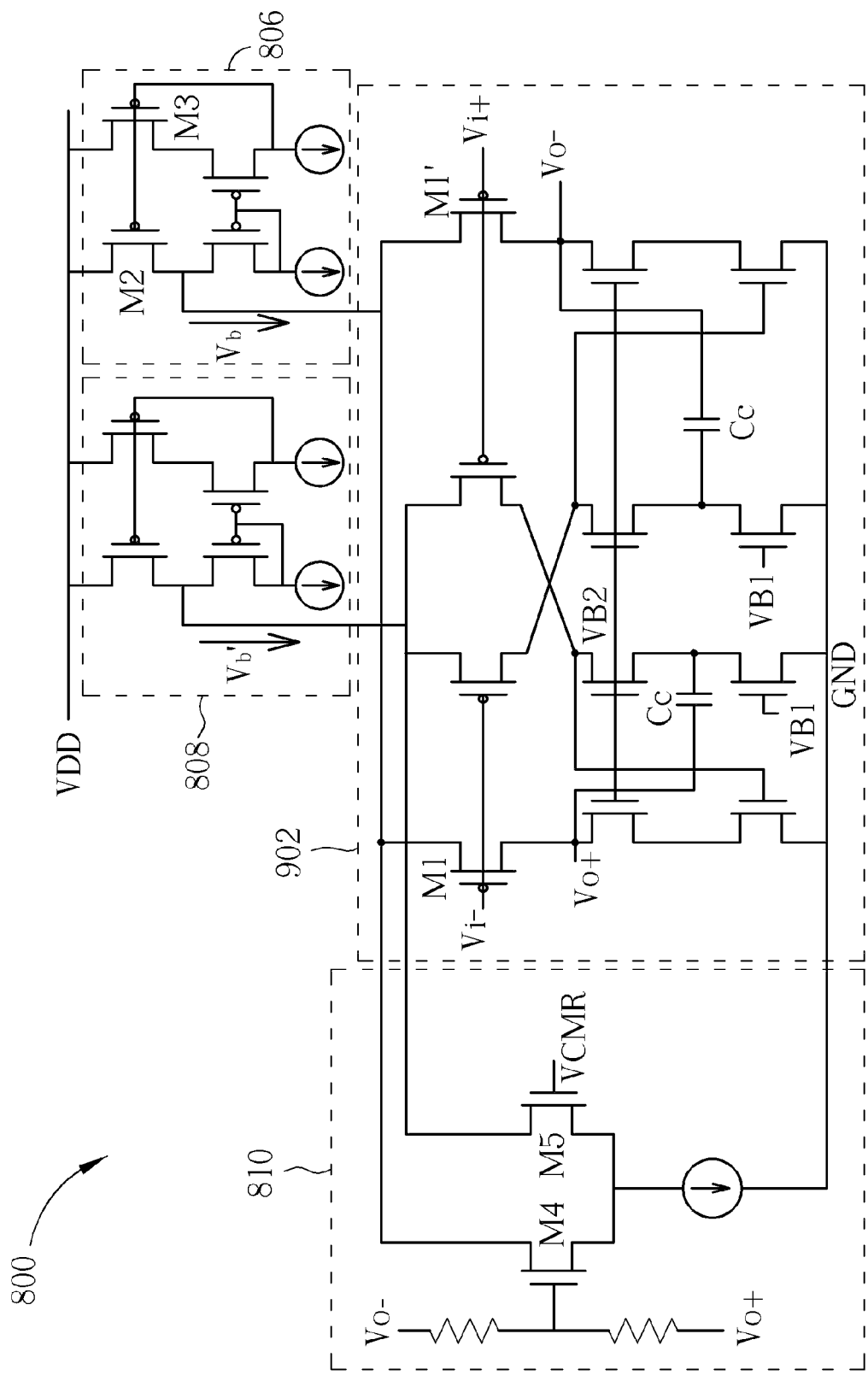
FIG. 9 is a circuit diagram of one implementation of the exemplary operational amplifier shown in FIG. 8.

Please refer to FIG. 9 in conjunction with FIG. 8. FIG. 9 is a circuit diagram of one implementation of the exemplary operational amplifier 800 shown in FIG. 8. The circuit block 902 includes a plurality of transistors operated according to input voltages Vi+ and Vi− and bias voltages VB1 and VB2, and provides one-stage amplification, which serves as the second signal processing block 804, and two-stage amplification, which serves as the first signal processing block 802. To keep the output differential pair M1 and M1' in saturation and maximize the output swing, the input common-mode voltage has to be set higher, which leaves no headroom for tail current source. Moreover, there is a voltage step on the input voltages Vi+ and Vi− when the switched-capacitor DAC is applied. Therefore, there is difficulty in operating the operational amplifier under 1.2V supply voltage. The present invention therefore proposes using the current clamping circuit to mitigate such a problem by tracking $V_{ds}$ of transistor M3 with the transistor M2. The clamping circuit demonstrates high output resistance even at 50 mV $V_{ds}$. The transistors M4 and M5 form the current-mode CMFB circuit 810 without any mirror pole, and control the common-mode voltage according to a reference voltage VCMR and a voltage-divided voltage derived from the output voltages Vo+ and Vo−.

Figure 10:
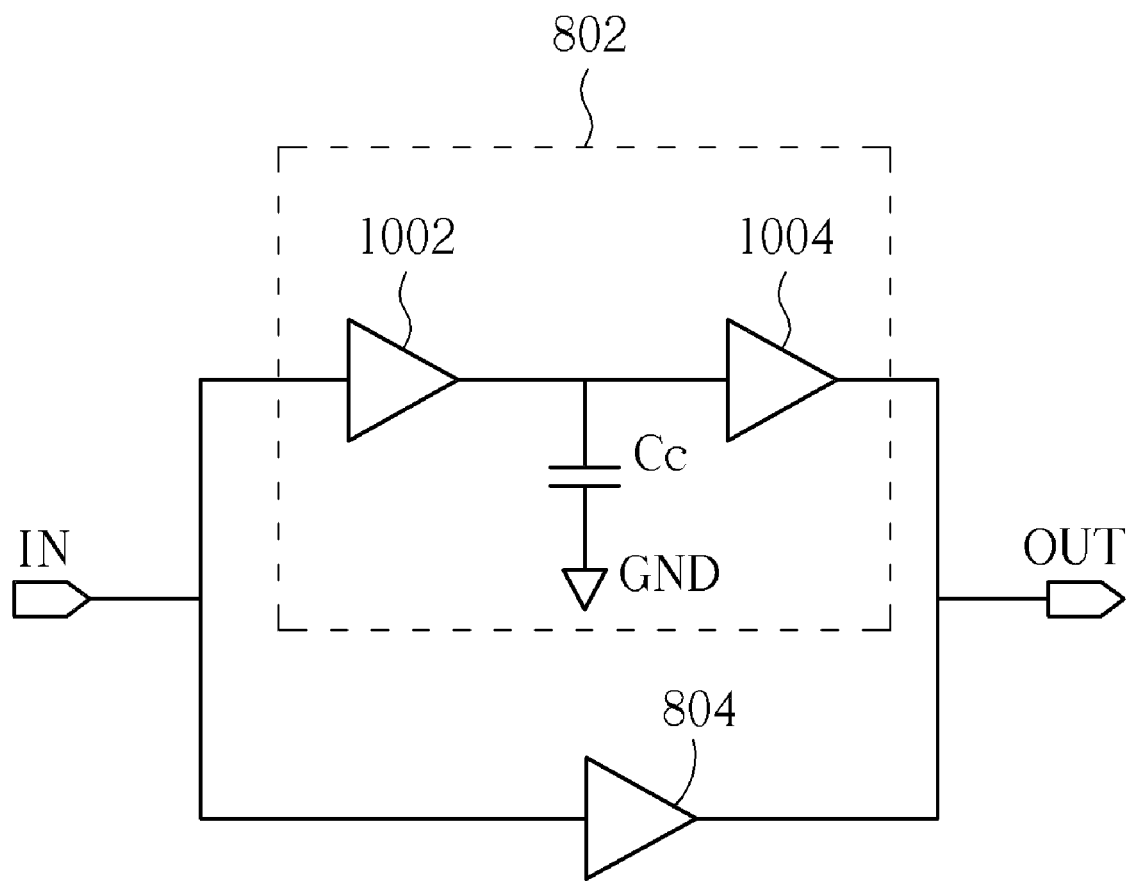
FIG. 10 is a diagram illustrating a first exemplary placement of a compensation capacitive element according to the present invention.
Figure 11:
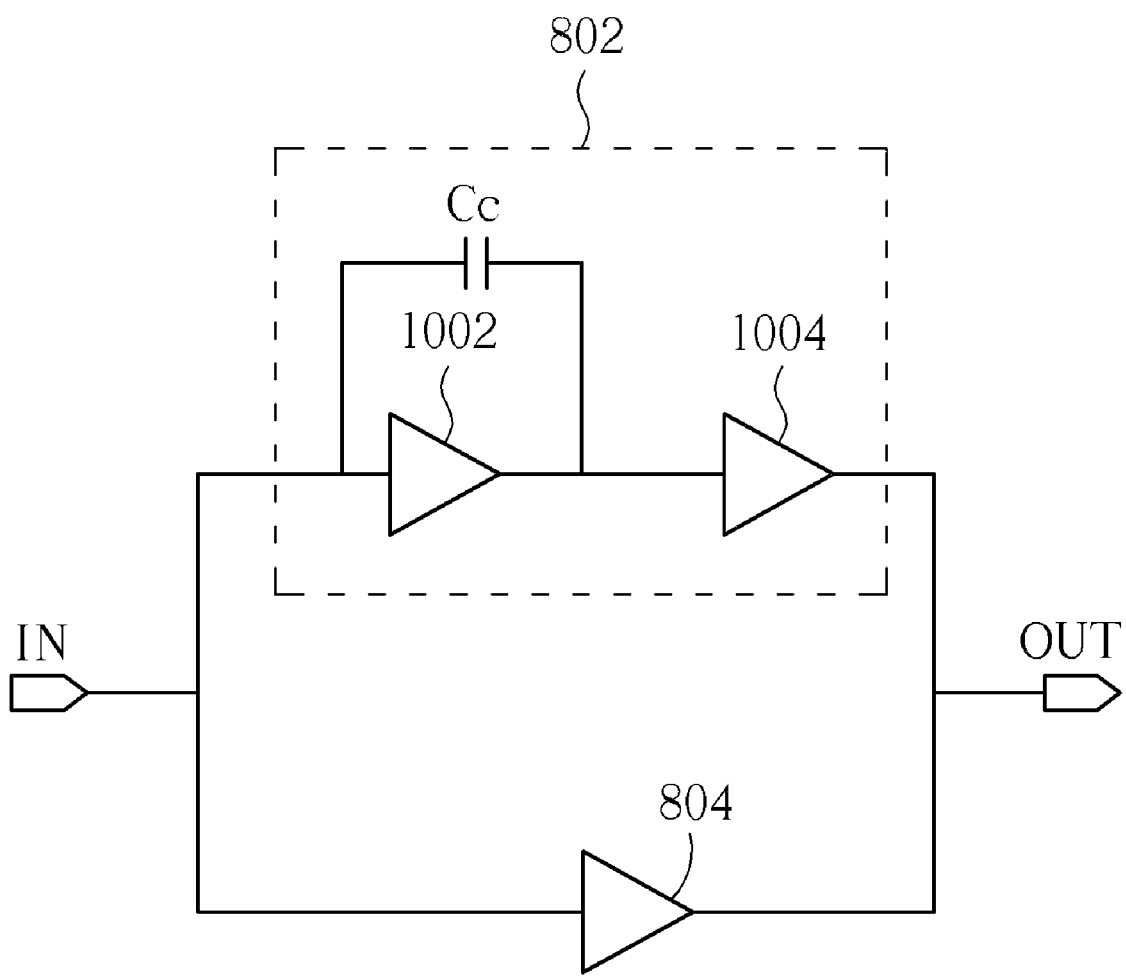
FIG. 11 is a diagram illustrating a second exemplary placement of a compensation capacitive element according to the present invention.

In addition, a compensation capacitive element Cc can be used to add a dominant pole to the low-BW path (i.e., the first signal processing block 802) such that the high-BW path (i.e., the second signal processing block 804) can take over earlier to improve the phase margin. FIG. 10 is a diagram illustrating a first exemplary placement of the compensation capacitive element Cc according to the present invention. The first signal processing block 802 includes a first stage 1002 and a second stage 1004, and the compensation capacitive element Cc is coupled between the output node of the first stage 1002 (the input node of the second stage 1004) and a grounding node GND. FIG. 11 is a diagram illustrating a second exemplary placement of the compensation capacitive element Cc according to the present invention. As one can see, the compensation capacitive element Cc in this alternative design is coupled between the input node and the output node of the first stage 1002.

Please note that the above exemplary embodiments/implementations are for illustrative purposes only, and are not meant to be limitations to the scope of the present invention. For example, instead of being applied to operational amplifier(s) in the loop filter 104 shown in FIG. 2, the operation amplifier architecture shown in FIG. 9 and related alternative designs may be applied to other circuit blocks within the delta-sigma analog-to-digital converter. Moreover, the exemplary DAC 112 shown in FIG. 7 is a multi-bit switched-capacitor DAC. However, the architecture of the DAC unit 702 can also be employed to realize a single-bit switched-capacitor DAC used in the delta-sigma analog-to-digital converter. Referring to FIG. 2, FIG. 5, FIG. 7, and FIG. 9, each of the illustrated circuits is based on a differential configuration; however, with moderate modifications, the technical features mentioned above can be applied to a single-ended configuration. Furthermore, the above-mentioned technical features are applied to building blocks within a continuous-time delta-sigma analog-to-digital converter; however, any delta-sigma analog-to-digital converter using one or more technical features mentioned above falls within the scope of the present invention. These alternative designs all obeys the spirit of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A loop filter implemented in a delta-sigma analog-to-digital converter the loop filter comprising:
a plurality of integrators coupled in series, comprising a first integrator and a second integrator;
a first positive feedback resistive element, placed in a first positive feedback path between a first output node of the second integrator and a first input node of the first integrator; and
a first negative feedback resistive element, placed in a first negative feedback path between a second output node of the second integrator and the first input node of the first integrator.

2. The loop filter of claim 1, wherein a resistive value of the first positive feedback resistive element is greater than a resistive value of the first negative feedback resistive element.

3. The loop filter of claim 1, further comprising:
a second positive feedback resistive element, placed in a second positive feedback path between the second output node of the second integrator and a second input node of the first integrator; and
a second negative feedback resistive element, placed in a second negative feedback path between the first output node of the second integrator and the second input node of the first integrator.

4. The loop filter of claim 3, wherein a resistive value of the first positive feedback resistive element is greater than a resistive value of the first negative feedback resistive element, and a resistive value of the second positive feedback resistive element is greater than a resistive value of the second negative feedback resistive element.

5. The loop filter of claim 1, wherein the delta-sigma analog-to-digital converter is a continuous-time delta-sigma analog-to-digital converter.

6. A digital-to-analog convert (DAC) implemented in a delta-sigma analog-to-digital converter comprising:
at least a DAC unit, each operated according to a clock signal to convert an input bit into an analog output and comprising:
a capacitive device;
a resistive device, for outputting the analog output to an operational amplifier input port within the delta-sigma analog-to-digital converter; and
a switch device, coupled between the capacitive device and the resistive device, for disconnecting the resistive device from the capacitive device and connecting a power source to the capacitive device to pre-charge the capacitive device when the clock signal is at a first logic level, and for disconnecting the power source from the capacitive device and connecting the resistive device to the capacitive device to generate the analog output in response to the input bit when the clock signal is at a second logic level different from the first logic level;
wherein the resistive device is coupled between the operational amplifier input port and the switch device.

7. The DAC of claim 6, comprising a plurality of DAC units operated according to the clock signal to convert a plurality of input bits into a plurality of analog outputs, simultaneously and respectively.

8. The DAC of claim 6, wherein:
the power source comprises a first supply voltage and a second supply voltage;
the capacitive device comprises:
a first capacitive element, coupled between a grounding node and a first node; and
a second capacitive element, coupled between the grounding node and a second node;
the resistive device comprises:
a first resistive element; and
a second resistive element;
the switch device comprises:
a first switch, coupled between the first supply voltage and the first node;
a second switch, coupled between the second supply voltage and the second node, wherein the first switch and the second switch are both turned on when the clock signal is at the first logic level;
a third switch, coupled between the first resistive element and the first node;
a fourth switch, coupled between the second resistive element and the second node, wherein the third switch and the fourth switch are both turned on when the clock signal is at the second logic level and the input bit has a first logic value;
a fifth switch, coupled between the first resistive element and the second node; and
a sixth switch, coupled between the second resistive element and the first node, wherein the fifth switch and the sixth switch are both turned on when the clock signal is at the second logic level and the input bit has a second logic value different from the first logic value.

9. The DAC of claim 6, wherein the delta-sigma analog-to-digital converter is a continuous-time delta-sigma analog-to-digital converter.

10. An operational amplifier implemented in a delta-sigma analog-to-digital converter comprising:
a first signal processing block, coupled between an input port and an output port of the operational amplifier;
a second signal processing block, coupled between the input port and the output port of the operational amplifier, wherein compared with the first signal processing block, the second signal processing block has a lower gain and a higher bandwidth;
a first current clamping circuit, coupled to the first signal processing block, for clamping a first bias current provided to the first signal processing block; and
a second current clamping circuit, coupled to the second signal processing block, for clamping a second bias current provided to the second signal processing block.

11. The operational amplifier of claim 10, further comprising:
a current-mode common-mode feedback (CMFB) circuit, coupled to nodes where the first current clamping circuit and the second first current clamping circuit connected to the first signal processing block and the second signal processing block.

12. The operational amplifier of claim 10, wherein the first signal processing block comprises a first stage and a second stage, an output node of the first stage is coupled to an input node of the second stage, and the first signal processing block further comprises:

a compensation capacitive element, coupled between the output node of the first stage and a grounding node.

13. The operational amplifier of claim 10, wherein the first signal processing block comprises a first stage and a second stage, an output node of the first stage is coupled to an input node of the second stage, and the first signal processing block further comprises:

a compensation capacitive element, coupled between an input node of the first stage and the output node of the first stage.

14. The operational amplifier of claim 10, being implemented in a loop filter of the delta-sigma analog-to-digital converter.

15. The operational amplifier of claim 10, wherein the delta-sigma analog-to-digital converter is a continuous-time delta-sigma analog-to-digital converter.

* * * * *